US012580587B2

(12) United States Patent
Martelock et al.

(10) Patent No.: US 12,580,587 B2
(45) Date of Patent: Mar. 17, 2026

(54) DYNAMIC CONTENT ENCODING

(71) Applicant: Apple Inc., Cupertino, CA (US)

(72) Inventors: Christian T. Martelock, Los Gatos, CA (US); Ali Sazegari, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 77 days.

(21) Appl. No.: 18/604,432

(22) Filed: Mar. 13, 2024

(65) Prior Publication Data

US 2025/0183912 A1 Jun. 5, 2025

Related U.S. Application Data

(60) Provisional application No. 63/605,467, filed on Dec. 1, 2023.

(51) Int. Cl.
*H03M 7/30* (2006.01)
*H03M 7/40* (2006.01)
(52) U.S. Cl.
CPC ....... *H03M 7/3071* (2013.01); *H03M 7/3079* (2013.01); *H03M 7/4006* (2013.01)
(58) Field of Classification Search
CPC . H03M 7/3071; H03M 7/3079; H03M 7/4006
USPC ...................................................... 341/50–51
See application file for complete search history.

(56) References Cited

U.S. PATENT DOCUMENTS

| | | | | |
|---|---|---|---|---|
| 11,803,693 B2 * | 10/2023 | Lempel | ............... | H03M 7/3084 |
| 2009/0177799 A1 | 7/2009 | Fitzek et al. | | |
| 2023/0344445 A1 * | 10/2023 | Martelock | ........... | H03M 7/3071 |

OTHER PUBLICATIONS

International Search Report and Written Opinion from PCT/US2024/057190, dated Mar. 21, 2025, 11 pages.
Mahoney, "Data compression Explained," retrieved from http://mattmahoney.net/dc/dce.html#Section_13, Apr. 15, 2013, 70 pages.

* cited by examiner

*Primary Examiner* — Khai M Nguyen
(74) *Attorney, Agent, or Firm* — BAKERHOSTETLER

(57) ABSTRACT

An output stream can be generated of compressed textual data. A first portion of the output stream includes an indicator that compression is used and a second portion is the compressed textual data. The textual data can be compressed by processing each byte of an input text bit-by-bit in order from most significant bit to least significant bit to generate an n-byte length context and a word context. While processing each byte, a subsequent bit is predicted based on the n-byte length context and a corresponding prediction model, and the subsequent bit is predicted based on the word context and a corresponding prediction model. The predictions can be combined to generate a final prediction. If the final prediction determines the subsequent bit, then the subsequent bit can be skipped in the output stream. The output stream can be provided to another device over a communication interface.

20 Claims, 7 Drawing Sheets

100

110

130

106

NETWORK

120

150

SERVER

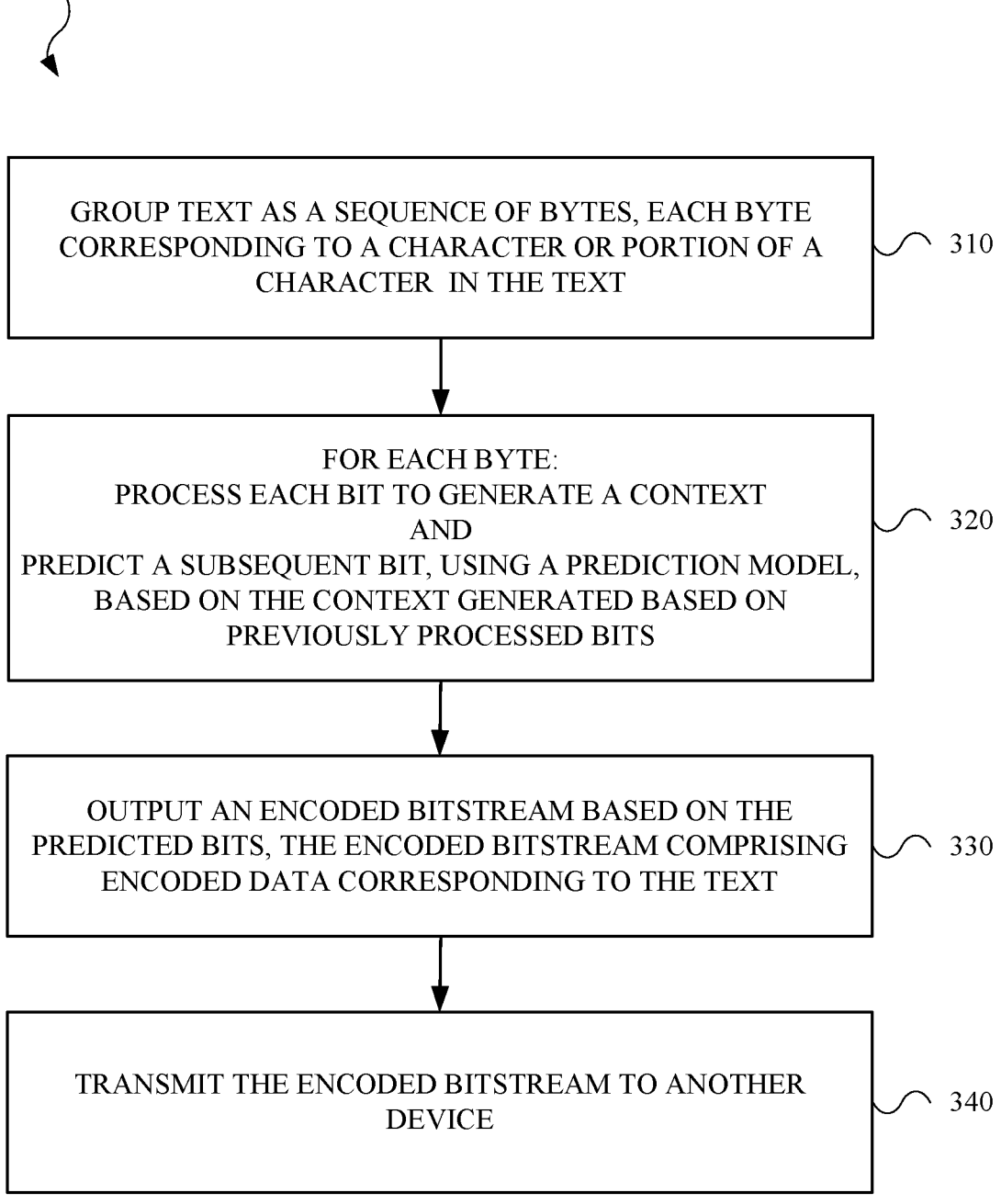

300

GROUP TEXT AS A SEQUENCE OF BYTES, EACH BYTE
CORRESPONDING TO A CHARACTER OR PORTION OF A
CHARACTER  IN THE TEXT          310

FOR EACH BYTE:
PROCESS EACH BIT TO GENERATE A CONTEXT
AND
PREDICT A SUBSEQUENT BIT, USING A PREDICTION MODEL,
BASED ON THE CONTEXT GENERATED BASED ON
PREVIOUSLY PROCESSED BITS          320

OUTPUT AN ENCODED BITSTREAM BASED ON THE
PREDICTED BITS, THE ENCODED BITSTREAM COMPRISING
ENCODED DATA CORRESPONDING TO THE TEXT          330

TRANSMIT THE ENCODED BITSTREAM TO ANOTHER
DEVICE          340

GENERATE A PROBABILITY THAT THE
SUBSEQUENT BIT IS 1 USING
A PREDETERMINED NUMBER
OF PREVIOUSLY PROCESSED BITS                    510

COMBINE PROBABILITIES GENERATED USING
VARIOUS NUMBERS OF PREVIOUSLY
PROCESSED BITS USING MAPPING IN A
MIXING TREE TO OBTAIN A ROOT                    520

PROCESS A CURRENT BIT USING PREDICTION
OBTAINED FROM THE ROOT                          530

700

DYNAMIC CONTENT ENCODING

CROSS-REFERENCE TO RELATED APPLICATIONS

This application claims the benefit of U.S. Provisional Application No. 63/605,467, entitled "DYNAMIC CONTENT ENCODING," filed Dec. 1, 2023, the entirety of which is incorporated herein by reference. This application is also subject-matter related to U.S. patent application Ser. No. 18/077,196, entitled "Dynamic Content Encoding", filed on Dec. 7, 2022, which is hereby incorporated herein in its entirety.

TECHNICAL FIELD

The present description relates generally to data compression, and in particular to a lossless data compression for messages.

BACKGROUND

Lossless data compression is used in many places in operating systems, for software and asset distribution, for content encodings (e.g., embedded in communication protocols), and the like. In the case of content encodings, it is possible to distinguish between static and dynamic content. Usually, dynamic content is only encoded, transmitted, and decoded once. Existing compression schemes work better on dynamic content which is lengthy because they generally utilize repetition in content encodings to replace longer repeated sequences with shorter representations of those sequences. However, existing compression schemes may provide poor compression for very short content encodings because there is less repetition due to their shortness.

BRIEF DESCRIPTION OF THE DRAWINGS

Certain features of the subject technology are set forth in the appended claims. However, for purpose of explanation, several embodiments of the subject technology are set forth in the following figures.

FIG. 3 illustrates a flow diagram of an example process for coding an input stream in accordance with one or more implementations.

DETAILED DESCRIPTION

Figure 1:
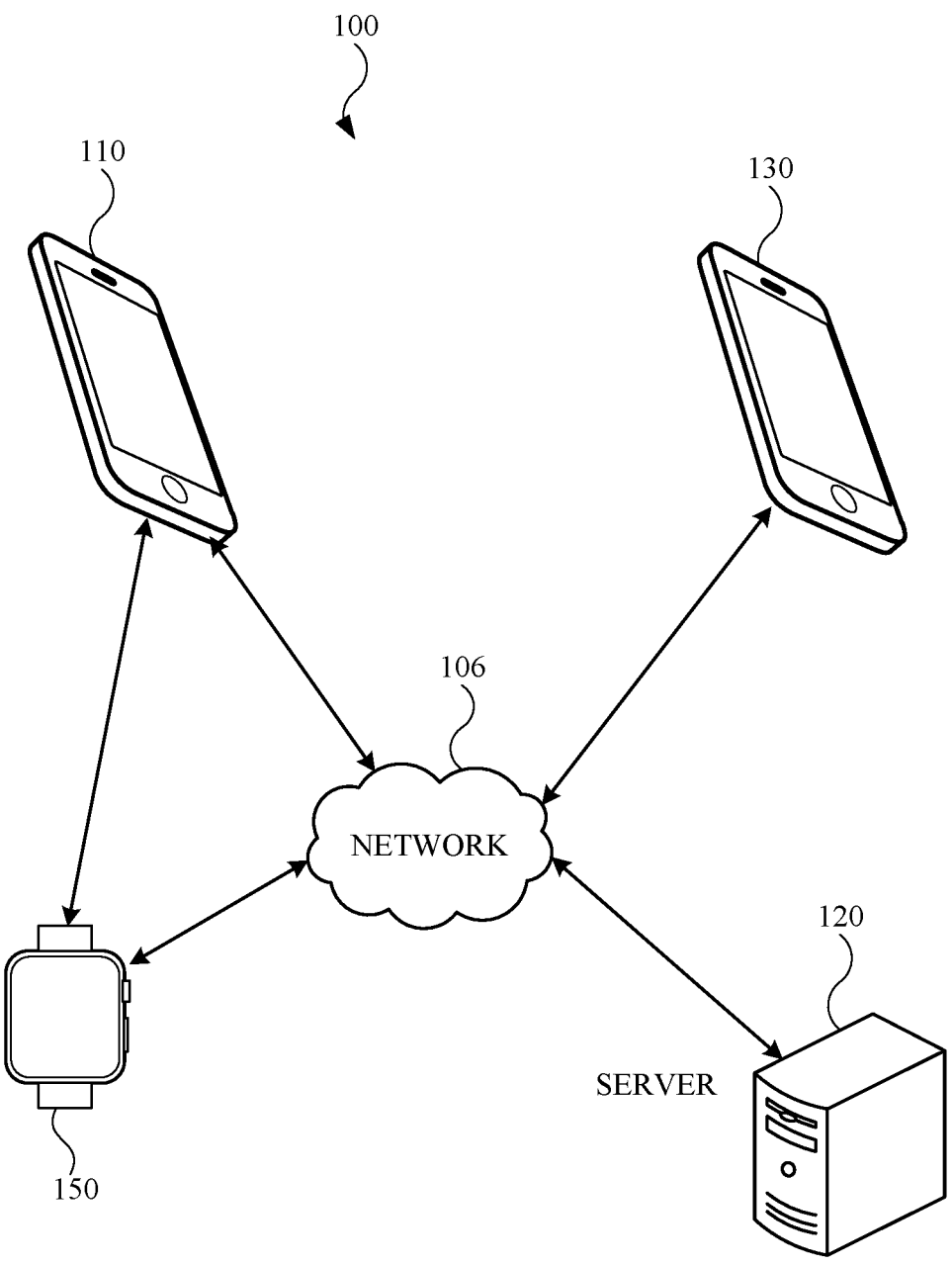
FIG. 1 illustrates an example of an environment in which state information between devices is exchanged in accordance with one or more implementations.

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, the subject technology is not limited to the specific details set forth herein and can be practiced using one or more other implementations. In one or more implementations, structures and components are shown in block diagram form in order to avoid obscuring the concepts of the subject technology.

A message may include characters in a character coded format. Such character coded formats include, for example, the American Standard Code for Information Interchange (ASCII) as a common character code format. Other formats provide support for additional character sets, such as Unicode Transformation Format (UTF or Unicode) (e.g., UTF-8). Character coded formats are convenient to use because a wide range of characters can be supported. When messages encoded in character code formats are sent from one device to another device over a communication network, often these messages are compressed, that is encoded into a format that requires less memory so that the bandwidth needed to transfer the message is reduced. There are several schemes that may be used for compression of such messages. Many of such schemes involve replacing repeating sequences of bytes with a replacement sequence and then providing a key for reversing the replacement for the receiving device to decode the message. Because these schemes are looking for repeating sequences, they are more effective when the message is long. When messages are shorter, however, the number of repeating sequences will be fewer and so these types of encoding schemes may not be very effective for compressing the message. Indeed, in some instances, the overhead required to implement the encoding scheme may make the encoded message longer than the original message of character codes.

The present disclosure provides systems, methods, and processes to encode short messages effectively. In situations where bandwidth is limited, the transmission savings by utilizing the disclosed systems, methods, and processes may be more important than the processing and memory costs associated with utilizing a compression scheme. Moreover, the currently disclosed systems, methods, and processes employ a predictive encoding scheme that utilizes less processing power, less memory, and results in nearly as good compression performance as other predictive encoding schemes. Further, because the presently disclosed systems, methods, and processes requires pre-configured data to be available at the encoding/decoding devices, the utilization of less memory than other predictive encoding schemes provides the ability to deploy the pre-configured data on field devices without overly burdening the storage capabilities of such devices.

For example, in the context of very short text messages that may be sent, for example, from a wearable device to another device that may include and/or may be a server, the server may receive thousands of messages at substantially the same time. In such a context, it may be important to transmit each message to the server and have the server process each message in turn, while the time needed for encoding/decoding such short text messages may not be important. Moreover, in such contexts, the amount of data in each message may be short and there may not be any repetition within the message, making it difficult for conventional encoding methods to provide high compression. Consequently, memory consumption during encoding/decoding of dynamic content becomes an important parameter while time taken for encoding/decoding may not be as important.

The systems, methods, and processes described herein provide for lossless compression of very short messages (e.g., in one or more implementations, less than 200 characters), though messages of other lengths may also be processed. Using the systems, methods and processes described herein, encoding can be performed simultaneously thousands of times without necessarily increasing memory requirements.

The subject systems, methods, and processes utilize one or more n-gram models that can predict a subsequent bit using n previously processed bytes and m previously processed bits as context. Each of the n-gram models may generate a probability of the subsequent bit being a one ("1") using a hash look-up table based on the values of n previously processed bytes and m previously processed bits. The hash look-up table can be generated by training the n-gram model using a predefined data set. In other words, in one or more implementations the n-gram models are static and need not be retrained, and are shared by thousands of instances as part of the pre-configured data stored at the encoding and decoding devices. Further, the subject systems, methods, and processes may utilize a word model that can predict a subsequent bit using a context extended from each preceding character and the preceding bits of the next character until a separator is encountered. Each of the word models may generate a probability of the subsequent bit being a one ("1") using a hash look-up table based on the values of the previously processed bits. The hash look-up table can be generated by training the word model using a predefined data set. In other words, in one or more implementations the n-gram models and word model are static and need not be retrained, and are shared by thousands of instances as part of the pre-configured data stored at the encoding and decoding devices. Consequently the systems, methods and processes need a small amount of memory to encode a data stream-essentially the amount of memory utilized to store the hash look-up tables for the various n-gram models being used.

In this manner, the subject systems, methods, and processes can provide lossless compression of very short amount of data using a static prediction model that requires a small amount of memory and that can provide high compression ratio by compressing the data bit-by-bit instead of byte-by-byte.

The subject systems, methods and processes encode the text to be compressed by grouping the text as a sequence of bytes. To simplify the pre-configured data stored at the encoding and decoding devices, the encoded text may include a string of characters including, example, a space, a punctuation mark, a letter, a number, a special character available on a keyboard, and the like. Each byte in the sequence of bytes corresponds to a character in the text. In other encodings (like UTF-8), a single character might be represented by a sequence of bytes. For each byte, each bit, taken from the most significant to the least significant bit, is processed to generate a context. Then, using a prediction model, a subsequent bit is predicted based on the context generated using the previously processed bits. The prediction of the prediction model is a combination of prediction of a plurality of sub-models. The encoded bitstream is then output based on the predicted bits. The encoded bitstream includes encoded data corresponding to the text that is already processed.

FIG. 1 illustrates an example of an environment in which state information between devices is exchanged in accordance with one or more implementations. Not all of the depicted components may be used in all implementations, however, and one or more implementations may include additional or different components than those shown in the figure. Variations in the arrangement and type of the components may be made without departing from the spirit or scope of the claims as set forth herein. Additional components, different components, or fewer components may be provided.

The network environment 100 includes an electronic device 110, a server 120, an electronic device 130, and an electronic device 150. The network 106 may communicatively (directly or indirectly) couple the electronic device 110 and/or the server 120, the electronic device 150 and/or the server 120, the electronic device 130 and/or the server 120, the electronic device 110 and/or the electronic device 150. In one or more implementations, the network 106 may be an interconnected network of devices that may include, or may be communicatively coupled to, the Internet. For explanatory purposes, the network environment 100 is illustrated in FIG. 1 as including an electronic device 110, an electronic device 130, an electronic device 150, and a server 120; however, the network environment 100 may include any number of electronic devices and any number of servers.

The electronic device 110 and/or 130 may be, for example, a desktop computer, a portable computing device (e.g., a laptop computer, a smartphone, etc.), a peripheral device (e.g., a digital camera, headphones), a tablet device, a wearable device (e.g., a watch, a band, etc.), a computing device (e.g., an embedded computing device), and the like, or any other appropriate device.

In some implementations, the electronic device 110 and/or 130 includes, for example, one or more wireless interfaces, such as WLAN radios, cellular radios, Bluetooth radios, Zigbee radios, near field communication (NFC) radios, and/or other wireless radios.

Figure 7:
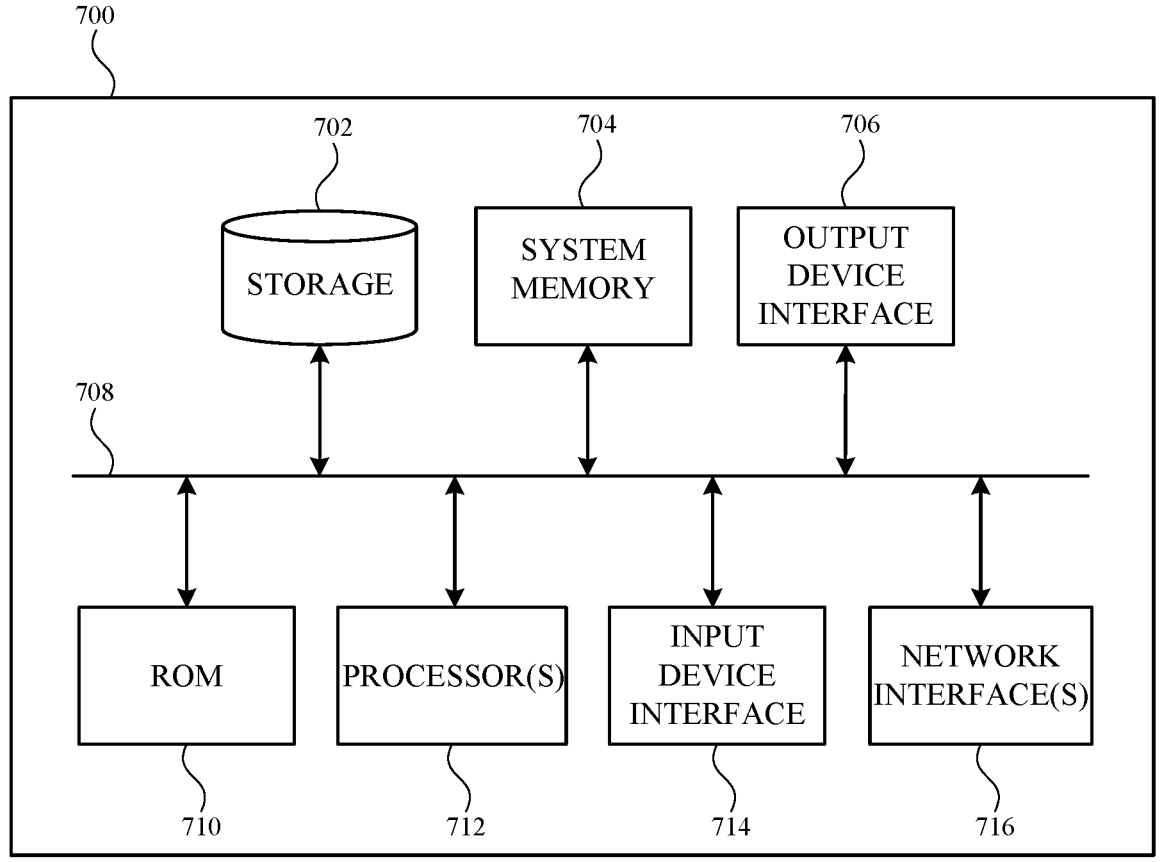
FIG. 7 illustrates an electronic system with which one or more implementations of the subject technology may be implemented.

The electronic device 110 and/or 130 may be, and/or may include all or part of, the electronic system discussed herein with respect to FIG. 7. In one or more implementations, the electronic device 110 and/or 130 may include a touchscreen, a camera, a microphone and/or other components. In some implementations, the electronic device 110 and/or 130 may be, for example, a portable computing device (e.g., a laptop computer) that includes a touchscreen, a smartphone that includes a touchscreen, a peripheral device that includes a touchscreen (e.g., a digital camera, headphones), a tablet device that includes a touchscreen, a wearable device that includes a touchscreen (e.g., a watch, a band, etc.), a computing device (e.g., an embedded computing device) that includes a touchscreen, and the like, any other appropriate device that includes, for example, a touchscreen, or any electronic device with a touchpad. The electronic device 110 and/or 130, may further include motion sensors such as gyroscopes, accelerometers, global positioning system (GPS) components, magnetic sensors such as compasses, and the like, and may be, for example, a smart phone or media player device. Additionally, the electronic devices 110 and 130 include a respective memory on which data can be stored. In FIG. 1, by way of example, the electronic devices 110 and 130 are depicted as smartphones.

In one or more implementations, the electronic device 150 may be, for example, a desktop computer, a portable computing device (e.g., a laptop computer, a smartphone, etc.), a peripheral device (e.g., a digital camera, headphones, etc.), a tablet device, a wearable device (e.g., a watch, a band, etc.), a computing device (e.g., an embedded computing device), and the like, or any other appropriate device. Other examples include an input device (e.g., stylus, mouse, track-pad, keyboard, camera, microphone etc.), output device (e.g., speaker, display, haptic output device, home pod, etc.), peripheral device, home automation device (e.g., thermostat, doorbell, light switch), smart appliance (e.g., fridge, etc.) sensor device (e.g., fingerprint sensor, biometric sensor, robot sensor, vehicle sensor, appliance sensor, etc.), computing device (e.g., phones, laptop, FPGA, embedded computing device, etc.), electronic key, wearable device, health tracking device, accessory device.

The electronic device 150 may include, for example, one or more wireless interfaces, such as WLAN radios, cellular radios, Bluetooth radios, Zigbee radios, near field communication (NFC) radios, and/or other wireless radios. The electronic device 150 may be, and/or may include all or part of, the electronic system discussed herein with respect to FIG. 7.

In one or more implementations, the device may include one or more input devices such as, for example, a touch activated input region or a button. In one or more implementations, the device may pair with other devices such as a desktop computer, a laptop or a portable computer, a mobile electronic device, or a wearable device.

In one or more implementations, the electronic device 150 may include a touchpad, one or more buttons, a camera, a microphone, one or more speakers, and/or other components. In some implementations, the electronic device 150 may be, for example, a peripheral device that includes a touchpad, a microphone and one or more speakers, (e.g., one or a pair of earphones or earbuds), a wearable device that includes a touchscreen, microphone and one or more speakers (e.g., a watch, a band, etc.), or any other appropriate device that includes, for example, one or more output devices. The electronic device 150, may further include one or more sensors (e.g., compasses, pressure sensors, touch sensors, and the like), and a processor for processing data (e.g., audio, video, audiovisual, and the like) (e.g., generated data, received data, stored data, data to be transmitted, etc.). Additionally, the electronic device 150 includes a memory on which data can be stored. In FIG. 1, by way of example, the electronic device 150 is depicted as a smartwatch. However, the electronic device 150 can be any suitable type of electronic device.

In one or more implementations, any of the electronic devices 110, 130, and/or 150 may be configured to enable a user to send short messages (e.g., pre-programmed or user defined messages) to a server, for example, in an emergency or for notifying a location (or a change in location), a status (or a change in status), and the like, to the server 120 and/or one of the other electronic devices 110, 130, and/or 150. In some implementations, the messages may be, e.g., less than 200 characters long. In some implementations, the electronic device 150 may automatically send short messages to the server 120 and/or the electronic devices 110, 130, and/or 150 without user intervention, for example, at timed intervals or upon a sensor input. The short messages may be in the form of a text or a string of characters in any language. In some implementations, the string of characters may be a transliteration of words from a language into English or any other language.

In one or more implementations, the server 120 provides a remote data storage for storing data associated with or generated by the electronic device 110, the electronic device 130, and/or the electronic device 150. It should be appreciated that the electronic device 110, the electronic device 130, the electronic device 150, and/or server 120 can access and exchange data stored on other devices and/or servers directly (e.g., without network 106) using wireless signals such as near-field communications (NFC), Bluetooth signals, direct WiFi signals, and/or wired connections.

By way of example, FIG. 1 shows a network environment 100 in which a first user may interact directly with the electronic device 110 and/or the electronic device 150 using input devices such as a touchscreen thereof to access and/or manipulate data stored on the electronic device 110, the electronic device 150, and/or the server 120 through an application such as text editor on the electronic device 110 or electronic device 150. A second user may interact directly with the electronic device 130 (and/or another secondary device communicatively coupled to the electronic device 130 (not shown)) using input devices such as a touchscreen thereof to access and/or manipulate data stored on the electronic device 130 and/or the server 120 through an application such as text editor on the electronic device 130. In such an environment, the electronic device 110 is the primary device for the first user while the server 120 and/or the electronic device 150 are the secondary device, and the electronic device 130 is the primary device for the second user while the server 120 is the secondary device.

For the sake of simplicity, actions described below are done so in the context of being performed on the electronic device 110 and/or electronic device 130 (e.g., by a first user); it should be understood, however, that such actions may instead or in addition be performed on the electronic device 130 (e.g., by a second user) (and/or any secondary devices like unto the electronic device 150 communicatively attached thereto).

Figure 2:
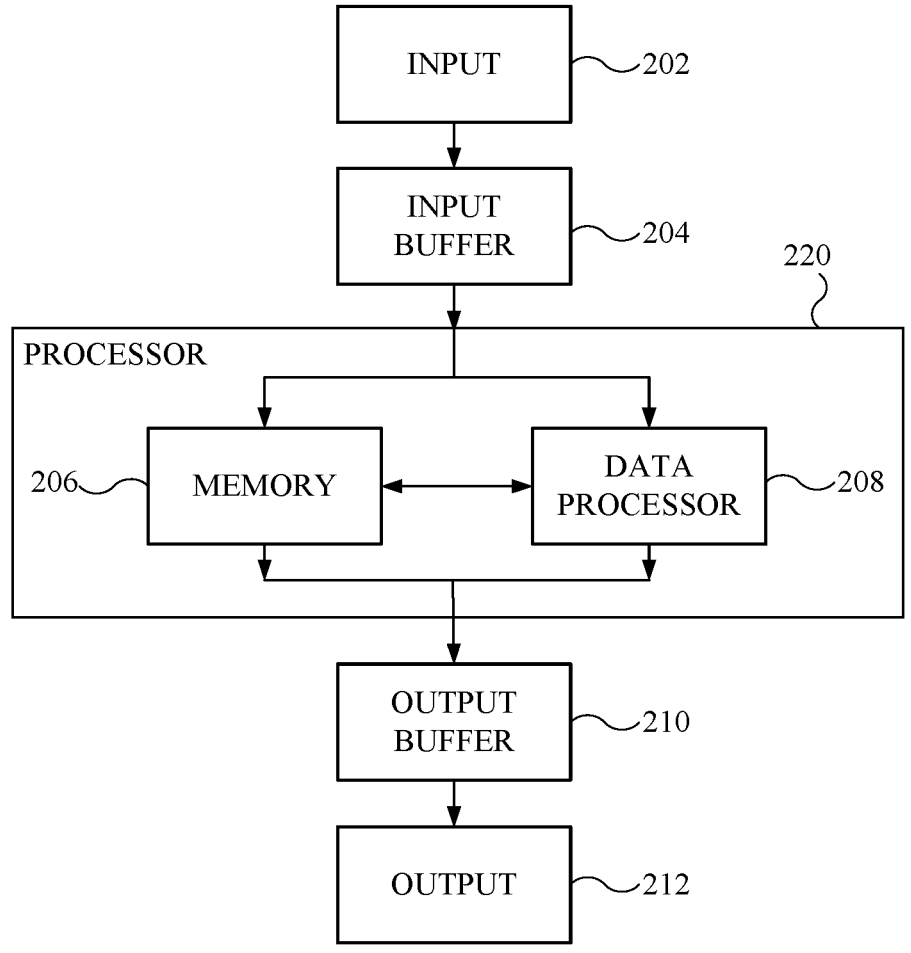
FIG. 2 illustrates data flow in a device used for processing data in accordance with one or more implementations.

FIG. 2 illustrates data flow in a device used for processing data in accordance with one or more implementations. Typical processing of data (e.g., at the electronic device 110 and/or electronic device 150) begins when the data is received at an input 202 and processed into an input buffer 204. The data is then transferred to a processor 220, where it is processed, and output to the output 212.

The processor 220 may include a memory 206 and a data processor 208. Depending on specific implementations, the processor 220 may also include other processors such as, for example, a graphics processor (which is not explicitly shown in FIG. 2). Thus, based on the type of device, the data processor 208 may perform, among other things, compression and/or decompression of the received data, encrypt the received data for storage, modulate or demodulate the received data, and/or perform other data manipulation.

In some implementations, each of the electronic devices 110, 130, and 150 and server 120 can include the data flow of FIG. 2. In some implementations such as a smartwatch or other secondary device, processing power, memory, and/or battery constraints may make it so that it is preferred for the compression to be performed on another device, such as the electronic device 110. Thus, the processor 220 of the smartwatch or other secondary device may receive the short message that is either generated at the smartwatch or other secondary device (e.g., pre-programmed or user defined messages) and send the short message without compression (e.g., in character code format) to the electronic device 110 as the primary device. The electronic device 110, in turn, may compress the short message using processes as described herein and send the compressed message to another device, such as the server 120, the electronic device 130, and/or the electronic device by way of the server 120.

In some implementations, the electronic devices 110 and 150 may exchange messages directly between each other which are compressed using processes described herein, for example, when a communications network communicatively coupling the two has low bandwidth due to protocol, distance, or other reasons.

For example, a message may be compressed using the encoding processes described herein and sent from the electronic device 110 or electronic device 150 to the server 120 or electronic device 130 in an emergency or for notifying a location (or a change in location), a status (or a change in status), and the like. In some implementations, the message may be additionally sent to another device such as, for example, a smartphone, a laptop computer, a desktop computer, or other electronic device that is paired to the electronic device 110 or 150.

In some implementations, a message, such as a Short Message Service (SMS) message, may be compressed by a first electronic device, such as the electronic device 110 or 150, using the encoding processes described herein and sent to a server, such as the server 120, which can then decompress the message. The server can then send the decompressed message as an SMS message to another electronic device, such as the electronic device 130 (which may not have the compression models loaded thereon). Similarly, the other electronic device can send an SMS message to the server, the server can compress the message using the encoding processes described herein, and then send the compressed message to the first electronic device.

In some implementations, because of the environment in which the electronic devices functions, the processor 220 may have limited processing resources and/or storage resources outside the processor 220 may be limited. Processing resources can include a processing unit (e.g., CPU), FPGA, ASIC, hardware electronic circuit, etc. For example, in some implementations, thousands of instances of data processing (e.g., a data compression and/or a data decompression) may need to be performed at the same time within given memory constraints. In some implementations, the processing resources of the processor 220 include a memory 206 which may be used as a cache or to provide a data buffer for certain data processing algorithms. Storage resources outside the processing resources may include other volatile or non-volatile memory.

In some implementations, the pre-configured data (e.g., hash tables) for encoding or decoding the messages may be stored in the processing resources and/or storage resources of the device. Thus, reducing the number of n-gram models and/or size of n-gram models may provide storage and processing resource gains.

For example, in some implementations, while processing the received data, the data processor 208 may store some or all of received data, processed data and/or intermediate data in memory 206. The memory 206 may include RAM, ROM, and/or non-volatile memory.

Upon or during the processing the data, the data processor 208 may write the processed data to the memory 206 and/or to an output buffer 210.

FIG. 3 illustrates a flow diagram of an example process 300 for encoding a sequence of characters in accordance with one or more implementations. At 310, text (e.g., received at a server, input by a user or automatically generated by an application) is grouped as a sequence of bytes. The text may include a sequence of characters, for example, encoded in a character code format such as ASCII or Unicode. Consequently, each byte may correspond to a character in the sequence of characters (for example, using ASCII or 1-byte Unicode) or to a portion of a character in the sequence of characters (for example, using 2-, 3-, or 4-byte Unicode characters). The characters may include, but are not limited to, a space, a punctuation mark, a letter, a number, a special character available on a keyboard, symbols, symbols, icons, emojis, symbol-based characters such as used in some languages, glyphs, and the like. Unless otherwise indicated the term "letter" can refer to any character that makes up a word or part of a word in any language. For example, in English, a letter refers to one of the letters of the English alphabet; in a Cyrillic based language, a letter refers to one of the letters of the Cyrillic alphabet; in a pictographical language like some Chinese languages, a letter refers to one of the Chinese characters; in a phonetic language, like Korean Hangul, a letter refers to one of the phonetic symbols; and so forth.

The text may be related to a message generated based on a user input or generated automatically by an application. For example, the text may be a text message sent by a messaging application or may be an SOS message in case of an emergency. The content of the message may depend on the type of emergency. For example, in some implementations, the message may include a type of emergency (e.g., as an abbreviation), a location and the identity of the user or owner of the device at which the message is generated. In some instances, a server may receive thousands of such messages generated by various devices across a network at the same time. Such messages may also need to be processed at the same time. However, the server may have limited memory capacity to encode all such messages at the same time.

Consequently, in some implementations, because the methods described herein require a small amount of memory for every instantiation, an electronic device and/or server may utilize the methods and processes described herein to encode and process such messages at the same time within memory constraints of the device.

Referring back to FIG. 3, the text being grouped may include any number or characters such as, for example, 5, 10, 15, 20, 25, 30, 35, 40, 45, 50, 55, 60, 65, 70, 75, 80, 85, 90, 95, 100, 110, 120, 130, 140, 150, 175, 200, 250, 300, 400, 500, 600, 700, 800, 900, 1000, or even more characters. Thus, in some implementations, the grouping of the text may correspondingly include the same number of bytes as the number of characters in the text or a multiple thereof. It will be appreciated that while the subject methods and processes are described as being useful for short or even very short messages, the subject methods and processes may be utilized for encoding text of any length (i.e., any number of characters).

At 320, each byte is processed so as to encode the text. In one or more implementations, the text may be represented by ASCII or other character codes. Thus, each bit of the byte is processed using binary decomposition from the most significant bit to the least significant bit to generate a context. Using a prediction model, based on the context generated from previously processed bits, a subsequent bit is predicted.

In one or more implementations, the prediction model may predict the subsequent bit based on a combinations of probabilities of the subsequent bit being 1 (and consequently also 0 by way of deduction, or vice versa). To arrive at the prediction, the prediction model may combine probabilities of the subsequent bit being 1 generated by one or more sub-models.

In one or more implementations, one or more of the sub-models may use a different number of previously processed bytes/bits as a context. In the discussed example, the sub-models may use 1, 2, or 4 previously processed bytes to generate a context. Such models are known in the art as n-gram models. Each of these contexts can be combined with a current context for already processed bits of the current byte to generate a probability of the subsequent bit being 1. Thus, a 1-gram model uses one previously processed byte to generate a probability of the subsequent bit being 1. Similarly, a 2-gram models uses two previously processed bytes and the processed bits of the current byte to generate a probability of the subsequent bit being 1. A 4-gram model uses four previously processed bytes and the processed bits of the current byte to generate a probability of the subsequent bit being 1, and so forth for other n-gram models of other lengths. The 1-gram, 2-gram, and 4-gram models were selected for the sub-models as being usefully predictive, however, it should be appreciated that other length gram models may be utilized in addition to or instead of these n-gram models. In general, the longer the n-gram model the more predictive it is, however, it also requires more processing resources to generate the prediction.

In one or more implementations, each of the n-gram models generates the probability of the subsequent bit being 1 using a hash table lookup for each n-gram model. The hash table may list the probability of the subsequent bit being 1 for each combination of n-number of previously processed bits. Thus, in some implementations, the hash table is addressed by using a concatenation of the sub-character context (the already processed bits of the currently considered byte) and the context provided by the n-gram model sub-model (1, 2, or 4 previously processed bytes) for determining a probability that the subsequent bit is 1. The sub-models can be trained on input data which is language agnostic and thus may support many languages.

In one or more implementations, another sub-model may be used in addition to or instead of the n-gram based sub-models which utilizes a previously processed string of characters (e.g., a word) in the text to generate a probability of the subsequent bit being 1. Such a sub-model may be referred to as a word-model. A word model may be trained to predict a subsequent character based on the previously processed characters of the word and generate a probability that the subsequent bit is 1 based on the predicted subsequent character. For example, if an input word is "hello", a prediction can be made after processing "hel". Perhaps the word is "help" or "hello" or another word. Thus, a prediction can be made for each bit in the subsequent character that the next bit corresponds to a 1. To provide a very limited example which considers only the case where the next letter may be an "l" or "p", if ASCII is used, for example, an "l" is "0110110" and a "p" is "01110000" so that a prediction (for "l" and "p") can be made for the bits 7 (not 1), 6, (1), 5 (1), 3 (not 1), 1 (not 1), and 0 (not 1), since these bits have the same values for both "l" and "p." After the fourth byte is processed, then a new context can be considered ("hell") when processing the next byte for "o".

In some implementations, the word model may be designed to work with almost any language. In some implementations, some simplifying limitations can be made to save on processing and memory storage of the word model. For example, the word model can be limited to only include alphabetic characters and language symbols, rather than spaces, punctuation, numbers, icons, and the like. Thus, in such implementations, when the next character in the string of characters does not represent a letter in a word (in any language), i.e., any other character, the next character can be treated as separator. Within a word, the word model's context is extended with each fully processed byte. In such implementations, after a separator, the word model behaves like a 0-gram model and provides a good baseline prediction.

In some implementations, the word model can be further simplified by utilizing preprocessing of the input data. One preprocessing that may be performed in some implementations is to perform a transformation on the input data to change all characters to lower case and to use special tag symbols so that the case data can be restored during decoding. For example, the phrase "Hello WORLD" can be changed to "!hello $world". In this example, the leading "!" tag indicates a capitalized first letter of the word and the "$" tag indicates that all the letters of the word should be capitalized. This way, many contexts of the word model get merged and thus provide better distributions and less hash collisions.

Another preprocessing that may be performed in some implementations is to utilize a domain specific transformation to replace frequently used words with shorter representations. This reduces the average message length and effectively increases the capacity of the n-gram models. For example, the phrase "on my way" can be replaced with "omw" as a preprocessing step. In another example, the relatively long word "emergency" can be replaced with "emrcy" or the like to reduce the length of the message. When the stream is eventually decoded by another device, these shortened words or phrases can be restored to what was conveyed in the original message.

Another preprocessing that may be performed in some implementations is to tag encode common number formats, such as phone numbers, coordinates, IP addresses, etc. into a more compact binary representation. For example, the IP address which is represented by individual character string of "192.168.0.1" can be tag encoded to "ˆc0a80001", where "ˆ" (or some other tag) indicates that the following 4 bytes (here depicted in hexadecimal) represent the individual numbers of the IP address. Thus, the length of the string may be reduced from 12 bytes to 5 bytes. Other tags can be used to indicate other number formats. For example, the "#" tag can be used to indicate any number so that the string, e.g., "565985", is converted to "#8A2E1 #", where "#" indicates that the encapsulated data is in binary format (here depicted in hexadecimal) rather than character code format. Rather than encapsulate the data by prepended and appended tags, the leading tag can be used and a space or punctuation separator can be used to indicate the end of the numerical data. When the stream is eventually decoded by another device, these tag encoded number formats can be restored to what was conveyed in the original message.

In some implementations, the sub-models are trained using a known data set. For example, the sub-models may be trained using a known passage of text (e.g., a book or a selected passage of conversation) in a given language. It will be understood that while the sub-models are trained to generate a probability of the subsequent bit being 1, using a corresponding number of previously processed characters, the sub-models can also be trained to predict a probability of the subsequent bit being 0. In addition, because the next bit can only be a 1 or a 0, the prediction of the converse bit is determined implicitly. For example, if the probability that the next bit is 1 is P=1 (100%), then the probability that the next bit is a 0 is P=0 (0%). Similarly, if the probability that the next bit is a 1 is P=0.6 (60%), then the probability that the next bit is a 0 is P=0.4 (40%).

In some implementations, the training data can be selected from a particular corpus or domain so that it is contextually relevant for the expected types of messages which are to be sent or received.

In one or more implementations, the prediction model may combine the probabilities generated by the one or more sub-models using a multi-dimensional function, such as a four-dimensional function. An example of this combination is described with respect to FIG. 4, below. As compared to other prediction model compression, a single four-dimensional function requires less processor resources than needed when combining additional sub-models which may require multiple levels of combinations (e.g., combining some sub-models with a first multi-dimensional function, other sub-models with a second multi-dimensional function, and then combining the outputs of those functions with another multi-dimensional function).

The output the prediction model can be used to generate the output stream, such as by using an arithmetic coder where the better the prediction, the less arithmetic coding space (bits) is needed for the output stream. In a sense, subsequent bits that are predicted to be a 1 are skipped from being represented in the output stream. The output stream can be sent from the processing device to another device, such as described above. The other device also has the same n-gram models and hash tables as the encoding device. The output stream can be decompressed by utilizing the same scheme for compression, except reversing the arithmetic coding, e.g., including the subsequent bits that were predicted to be a 1.

At 330, the process for encoding a sequence of characters ends by outputting an encoded bitstream based on the predicted bits, in accordance with one or more implementations. The encoded bitstream includes encoded data corresponding to the text being compressed.

At 340, the encoded bitstream may be transmitted to another device, such as the server 120 or one of the electronic devices 110, 130, and/or 150. In some implementations, the encoded bitstream may be transmitted to the other device through the network 106 or through another connection (such as illustrated in FIG. 1 between the electronic device 110 and the electronic device 150). In some implementations, the encoded bitstream may be transmitted to the other device by way of the server, such as the server 120, for example, by transmitting the encoded bitstream to the server and then the server transmitting the encoded bitstream to the other device and/or decoding the bitstream and transmitting the decoded bitstream to the other device.

In some implementations, the encoded bitstream can be decoded or decompressed by the server 120 prior to transmission to the other device, such as the electronic device 130, for example when the other device does not have the predictive model utilized to produce the encoded bitstream. For example, a message, such as a Short Message Service (SMS) message, may be compressed by a first electronic device, such as the electronic device 110 or 150, using the encoding processes described herein and sent to a server, such as the server 120, which can then decompress the message. The server can then send the decompressed message to another electronic device, such as the electronic device 130 (which may not have the compression models loaded thereon), for example, as an SMS message. Similarly, the other electronic device can send an SMS message to the server, the server can compress the message using the encoding processes described herein, and then send the compressed message to the first electronic device.

In some implementations where the server decompresses the message received from one of the electronic devices 110, 130, and/or 150, the message may be compressed again by the server using a different compression scheme or using a different set of predictive models for the subject compression processes, and the compressed message may be transmitted to the other device. For example, the server, such as the server 120, may utilize the prediction model as a first prediction model for decompressing the encoded bitstream, then utilize a second prediction model (for example, having different sub-models) to re-encode the message to a second encoded bitstream which is compatible with a prediction model stored at the other device.

Due to the first-in-first-out nature of the stream processing, the device that receives the encoded bitstream can immediately begin decoding the encoded bitstream as the stream is being received. In other words, the receiving device need not wait for the entire bitstream to be received. Because the encoding scheme has such low transaction overhead—just a length and bit indicator as described below with respect to FIG. 6—data can begin being decoded after just a few bytes are received.

Figure 4:
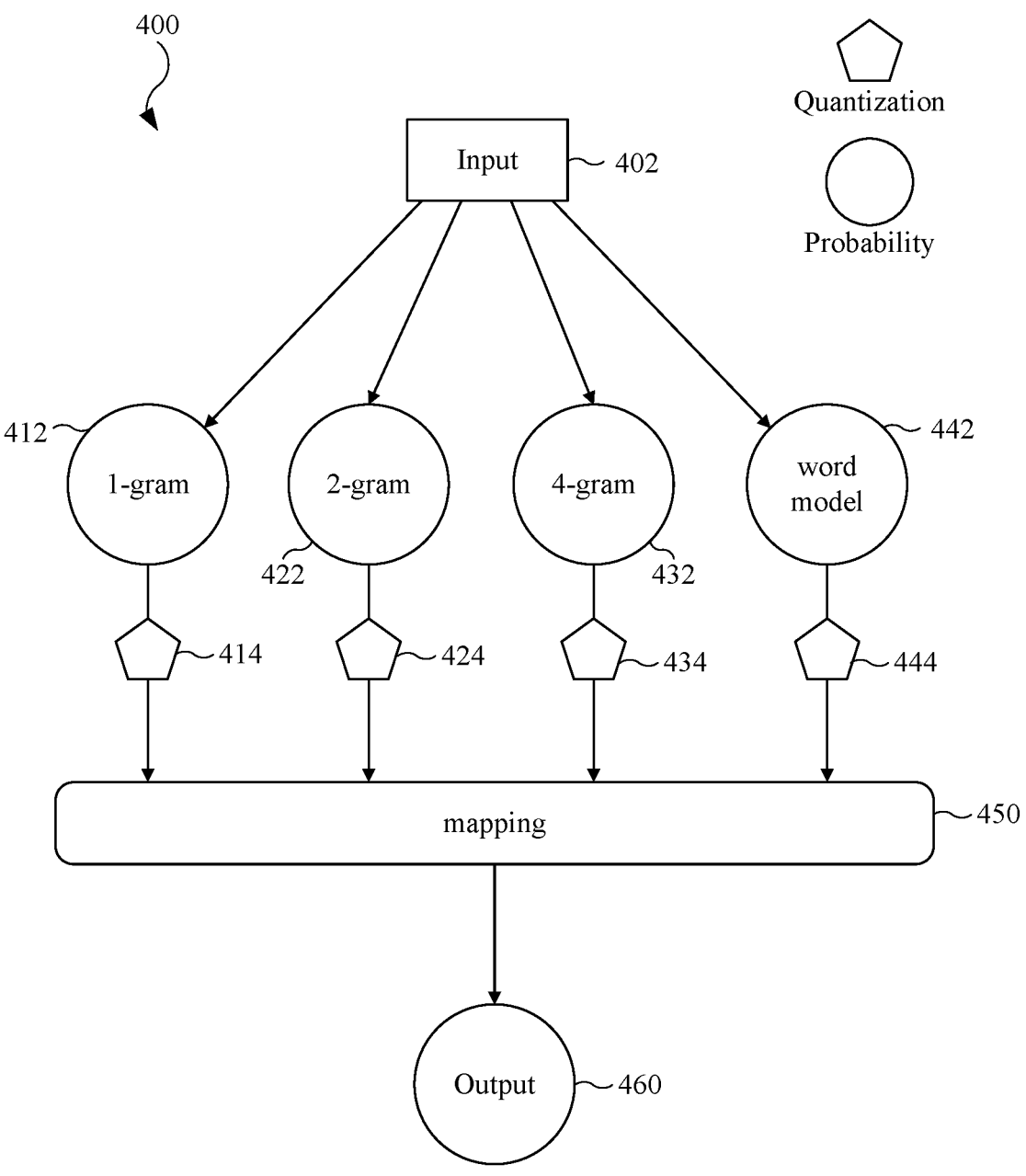
FIG. 4 is a schematic of a prediction model for predicting the subsequent bit based on previously processed bits in accordance with one or more implementations.

FIG. 4 illustrates a schematic 400 of a prediction model for predicting the subsequent bit based on previously processed bits, in accordance with one or more implementations. The example prediction model illustrated in FIG. 4 combines a plurality of sub-models using a four-dimensional mapper. In the example of FIG. 4, the prediction model utilizes 3 n-gram models (i.e., 1-gram model 412, 2-gram model 422, and 4-gram model 432), and a word model 442. Other length n-gram models may be used. Fewer or more n-gram models may be used. Additional word models may be used which are trained differently from each other.

Specifically, the prediction model shown in FIG. 4 takes the input 402, as described above as a stream of bytes, and combines different predictions from each of the sub-models among the 4 models being used using a four-dimensional mapper 450. In one or more implementations, the memory efficiency (and accuracy) of the combining can be improved by non-linearly quantizing input probabilities (e.g., providing higher precision near 0 or 1 probability values for the individual sub-models) prior to inputting into the four-dimensional mapping function, for example, using a quantization 414 on the output of the 1-gram model 412, a quantization 424 on the output of the 2-gram model 422, a quantization 434 on the output of the 4-gram model 432, and a quantization 444 on the output 460 of the word model 442.

The result of the combination of the sub-models is a prediction (e.g., a probability that the subsequent bit is 1), which can be utilized to process a current bit using an arithmetic coder. The coder may be simplified as the prediction of the subsequent bit improves in accuracy.

Figure 5:
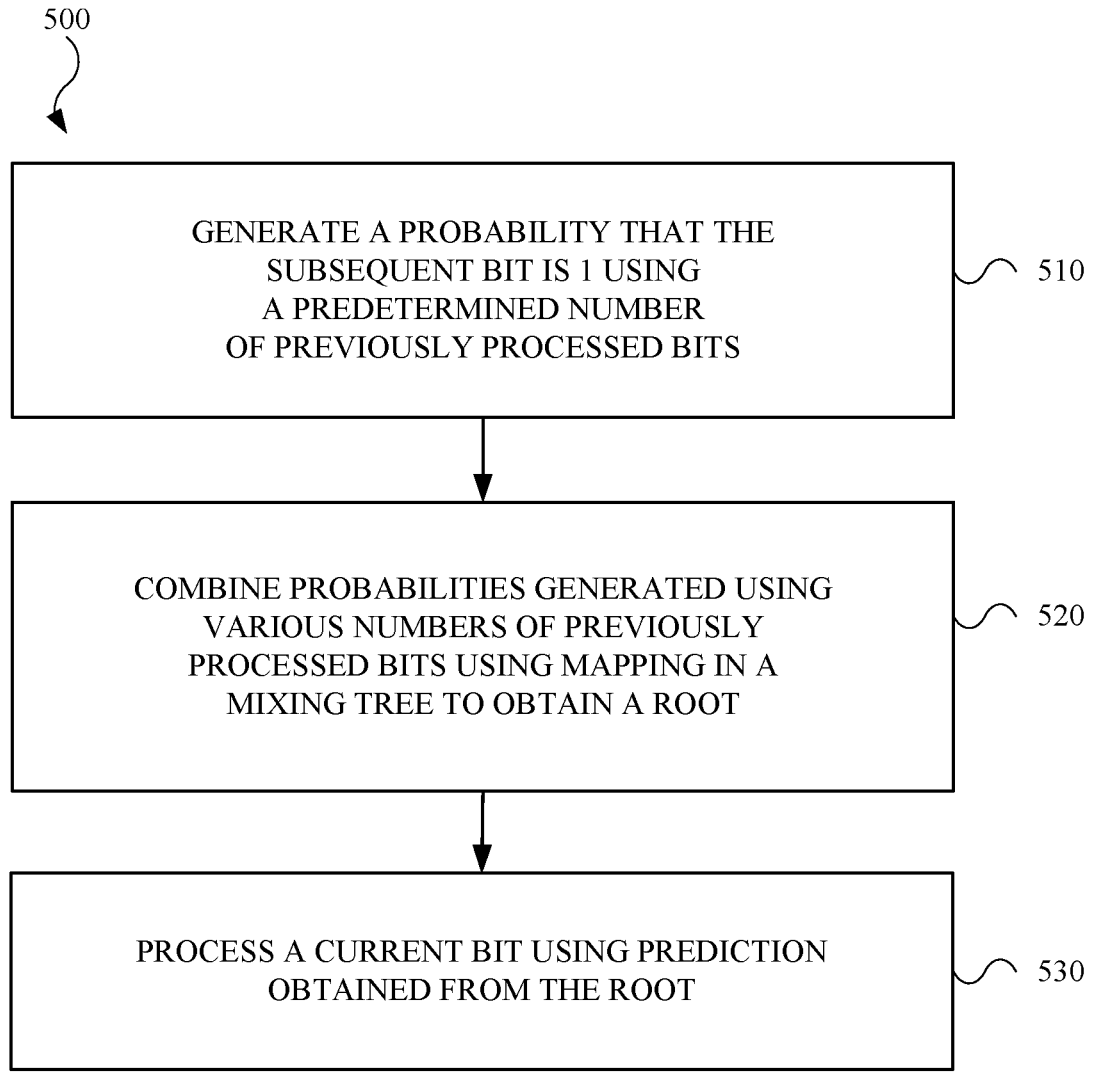
FIG. 5 illustrates a flow diagram for an example process of encoding a string of characters in accordance with one or more implementations.

FIG. 5 illustrates a flow diagram of an example process 500 for processing a current bit using a four-dimensional mapper of predictions from a plurality of sub-models in accordance with one or more implementations of the present disclosure. At 510, a plurality of probabilities that the subsequent bit is 1 are generated using a predetermined number of previously processed bytes. For example, as has been discussed with respect to FIG. 4, the predetermined number of bytes may be 1, 2, or 4, (corresponding to the 3 n-gram models), and a probability is generated for each of the n-gram sub-models utilized. In addition, a sub-model using a previously processed string of characters (e.g., a word) in the text may be used to generate a probability that the subsequent bit is 1.

At 520, the plurality of probabilities generated using various numbers of previously processed bits/bytes (as well as a probability generated using a string of characters) are combined using a multi-dimensional mapper. The mapper combines each of the probabilities by assigning relative weights to each of the predictions for each of the corresponding hash table entries. The mapping may be performed in four dimensions in some implementations. In one or more implementations, the probability generated by each of the sub-models may be quantized before being combined using a four-dimensional mapper.

The four-dimensional mapper includes a mapping algorithm in which predictions (that a subsequent bit is 1) are combined using a weighted summation over all models. In some implementations, the four-dimensional mapper may be trained using a known dataset and the weights may be adjusted along a gradient in a four-dimensional weight space to favor the models that accurately predicted the subsequent bit. The weights may be adjusted for each corresponding hash entry. For example, when a prediction is incorrect for one of the sub-models or a prediction is an outlier as compared to the predictions for the subsequent bit from other sub-models, that incorrect or outlier prediction for that hash entry of that sub-model can be weighted lower than other probabilities.

In the event of a hash collision, the results may simply be added together to achieve the prediction. This may introduce some noise into the predictions, but is computationally less intensive and requires less memory that other hash collision resolution schemes. Moreover, when a particular n-gram model tends to cause the hash collision for a particular mapping, the mapping can be trained to give less weight to that n-gram model for that mapping.

In one or more implementations, the combination of the models is performed using the scheme described by equation (1) below:

$$S_0 = \varepsilon + \Sigma_i w_i n_{0i} = \text{evidence for 0}$$

$$S_1 = \varepsilon + \Sigma_i w_i n_{1i} = \text{evidence for 1}$$

$$S = S_0 + S_1 = \text{total evidence}$$

$$p_0 = S_0/S = \text{probability that next bit is 0}$$

$$p_1 = S_1/S = \text{probability that next bit is 1} \tag{1}$$

where $w_i \geq 0$ is the weight of the i'th model, $n_{0i}$ and $n_{1i}$ are the outputs $n_0$ and $n_1$ by the i-th model, and $\varepsilon > 0$ is a small constant to guarantee that $S_0$, $S_1 > 0$ and $0 < p_0$, $p_1 < 1$.

In one or more implementations, after coding each bit, the weights may be adjusted along the cost gradient in weight space to favor the models that accurately predicted that bit. In some implementations, the weights can either be initialized to favor a-priori known better models, or simply be set to 0 to allow rapid initial training.

The predictions from equation (1), i.e., the output of the mapper, a root, may then be arithmetic coded. In some implementations the arithmetic code of a string x is the length of x together with a number in the half-open interval $[p_{<x}, p_{<x} + p(x))$, where $p_{<x}$ is the probability that a string picked at random is lexicographically less than x. Those of ordinary skill will appreciate that other arithmetic coding schemes are contemplated within the scope of the present disclosure.

It will be appreciated that each of the sub-models (i.e., the 3 n-gram models and the word model) are static models that do not need to be updated once the models are trained using a known dataset. Thus, the sub-models can be distributed to various electronic devices for encoding/decoding messages. Similarly, the four-dimensional mapping function may be trained by processing a known dataset to adjust the weights used in the mapping used for combining the various sub-models. The known dataset may be specific to a certain language and/or a certain context. As such, the four-dimensional mapping may likewise, once adjusted, be a static mapping for each of the sub-models and thus may be distributed to the various electronic devices for encoding/decoding messages.

At 530, the current bit is processed using the prediction obtained from the output of the mapper, e.g., a root for the arithmetic coder.

Figure 6:
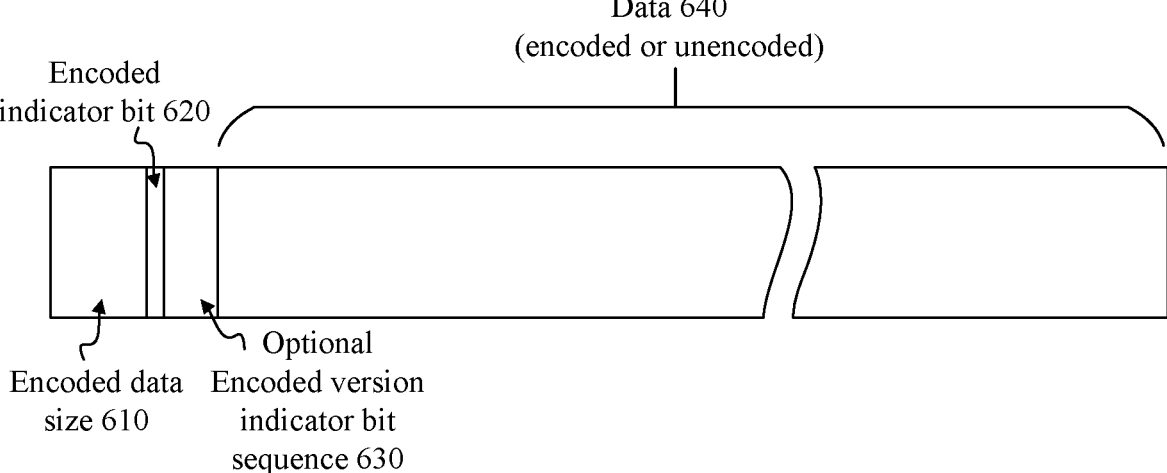
FIG. 6 illustrates a bitstream encoded using an example process in accordance with one or more implementations.

FIG. 6 illustrates an example of an encoded bitstream resulting from the process of encoding described herein. In one or more implementations, the encoded bitstream may include a first component 610 indicating a data size that is being encoded. The data size may be provided as number of bytes in some implementations. In some implementations, the first component 610 may be an encoded value of the data size is bytes using a suitable encoding scheme such as, for example, using Fibonacci encoding.

Next, the encoded bitstream includes an indicator bit 620 indicating whether the subsequent portion of the bitstream is encoded. For example, the indicator bit 620 being 1 indicates that the subsequent portion of the bitstream is encoded using an encoding process described herein, and the indicator bit 620 being 0 indicates that the subsequent portion of the bitstream is unencoded text (i.e., without compression).

Next, if applicable, a version indicator bit sequence 630, which is optional, can be provided following the indicator bit 620. When the bitstream is encoded, the version indicator bit sequence 630 can inform the decoding device which version of predictive models is used. Thus, a server can support legacy versions of the predictive models or language specific versions of the predictive models. The version indicator bit sequence 630 can be, for example 1, 2, 3, or 4 (or more) bits long.

Next, the data 640 can be provided following the indicator bit 620 or the version indicator bit sequence 630 (if used). The data 640 can be unencoded or encoded using a predictive model as described above.

FIG. 7 illustrates an electronic system 700 with which one or more implementations of the subject technology may be implemented. The electronic system 700 can be, and/or can be a part of, the electronic device 110, and/or the electronic device 130, and/or the electronic device 150, and/or the server 120, shown in FIG. 1. The electronic system 700 may include various types of computer readable media and interfaces for various other types of computer readable media. The electronic system 700 includes a bus 708, one or more processing unit(s) 712, a system memory 704 (and/or buffer), a ROM 710, a permanent storage device 702, an input device interface 714, an output device interface 706, and one or more network interfaces 716, or subsets and variations thereof.

The bus 708 collectively represents all system, peripheral, and chipset buses that communicatively connect the numerous internal devices of the electronic system 700. In one or more implementations, the bus 708 communicatively connects the one or more processing unit(s) 712 with the ROM 710, the system memory 704, and the permanent storage device 702. From these various memory units, the one or more processing unit(s) 712 retrieves instructions to execute and data to process in order to execute the processes of the subject disclosure. The one or more processing unit(s) 712 can be a single processor or a multi-core processor in different implementations.

The ROM 710 stores static data and instructions that are needed by the one or more processing unit(s) 712 and other modules of the electronic system 700. The permanent storage device 702, on the other hand, may be a read-and-write memory device. The permanent storage device 702 may be a non-volatile memory unit that stores instructions and data even when the electronic system 700 is off. In one or more implementations, a mass-storage device (such as a magnetic or optical disk and its corresponding disk drive) may be used as the permanent storage device 702.

In one or more implementations, a removable storage device (such as a floppy disk, flash drive, and its corresponding disk drive) may be used as the permanent storage device 702. Like the permanent storage device 702, the system memory 704 may be a read-and-write memory device. However, unlike the permanent storage device 702, the system memory 704 may be a volatile read-and-write memory, such as random access memory. The system memory 704 may store any of the instructions and data that one or more processing unit(s) 712 may need at runtime. In one or more implementations, the processes of the subject disclosure are stored in the system memory 704, the permanent storage device 702, and/or the ROM 710. From these various memory units, the one or more processing unit(s) 712 retrieves instructions to execute and data to process in order to execute the processes of one or more implementations.

The bus 708 also connects to the input and output device interfaces 714 and 706. The input device interface 714 enables a user to communicate information and select commands to the electronic system 700. Input devices that may be used with the input device interface 714 may include, for example, alphanumeric keyboards and pointing devices (also called "cursor control devices"). The output device interface 706 may enable, for example, the display of images generated by electronic system 700. Output devices that may be used with the output device interface 706 may include, for example, printers and display devices, such as a liquid crystal display (LCD), a light emitting diode (LED) display, an organic light emitting diode (OLED) display, a flexible display, a flat panel display, a solid state display, a projector, or any other device for outputting information. One or more implementations may include devices that function as both input and output devices, such as a touchscreen. In these implementations, feedback provided to the user can be any form of sensory feedback, such as visual feedback, auditory feedback, or tactile feedback; and input from the user can be received in any form, including acoustic, speech, or tactile input.

Finally, as shown in FIG. 7, the bus 708 also couples the electronic system 700 to one or more networks and/or to one or more network nodes through the one or more network interface(s) 716. In this manner, the electronic system 700 can be a part of a network of computers (such as a LAN, a wide area network ("WAN"), or an Intranet, or a network of networks, such as the Internet. Any or all components of the electronic system 700 can be used in conjunction with the subject disclosure.

In accordance with various aspects of the subject disclosure, a method includes grouping text as a sequence of bytes, the text comprising a string of characters, each byte corresponding to a character in the text. For each byte of the sequence of bytes: (i) each is processed bit from most significant bit to least significant bit to generate a context; and a subsequent bit is predicted, using a prediction model, based on the context generated based on previously processed bits, prediction of the prediction model being a combination of predictions of a plurality of sub-models. An encoded bitstream is output based on the predicted bits, the encoded bitstream comprising encoded data corresponding to the text.

In accordance with various aspects of the subject disclosure, a non-transitory computer-readable medium is provided that includes instructions, which when executed by at least one computing device, cause the at least one computing device to perform operations including grouping text as a sequence of bytes, the text comprising a string of characters, each byte corresponding to a character in the text. For each byte of the sequence of bytes: (i) each is processed bit from most significant bit to least significant bit to generate a context; and a subsequent bit is predicted, using a prediction model, based on the context generated based on previously processed bits, prediction of the prediction model being a combination of predictions of a plurality of sub-models. An encoded bitstream is output based on the predicted bits, the encoded bitstream comprising encoded data corresponding to the text.

In accordance with various aspects of the subject disclosure, a device is provided that includes a memory and at least one processor communicatively coupled to the memory. The at least one processor is configured to group text as a sequence of bytes, the text comprising a string of characters, each byte corresponding to a character or a portion of a character in the text. For each byte of the sequence of bytes: (i) each is processed bit from most significant bit to least significant bit to generate a context; and a subsequent bit is predicted, using a prediction model, based on the context generated based on previously processed bits, prediction of the prediction model being a combination of predictions of a plurality of sub-models. An encoded bitstream is output based on the predicted bits, the encoded bitstream comprising encoded data corresponding to the text.

The devices, methods and systems disclosed herein enable lossless compression of very small amount of data. Experiments conducted using known datasets indicate that compression of data using the methods, devices and systems described herein begin as early as the $4^{th}$ or $5^{th}$ byte of the text data being encoded. Those of skill in the art will appreciate that because the models and sub-models being used herein are static and require relatively small amounts of memory, a large number of instances of the encoding (or decoding) process can be run at the same time within a given architecture. Advantageously, the compression using the devices, methods and systems described herein can begin faster in comparison to dynamic models because loading of large dynamic model datasets is avoided.

Implementations within the scope of the present disclosure can be partially or entirely realized using a tangible computer-readable storage medium (or multiple tangible computer-readable storage media of one or more types) encoding one or more instructions. The tangible computer-readable storage medium also can be non-transitory in nature.

The computer-readable storage medium can be any storage medium that can be read, written, or otherwise accessed by a general purpose or special purpose computing device, including any processing electronics and/or processing circuitry capable of executing instructions. For example, without limitation, the computer-readable medium can include any volatile semiconductor memory, such as RAM, DRAM, SRAM, T-RAM, Z-RAM, and TTRAM. The computer-readable medium also can include any non-volatile semiconductor memory, such as ROM, PROM, EPROM, EEPROM, NVRAM, flash, nvSRAM, FeRAM, FeTRAM, MRAM, PRAM, CBRAM, SONOS, RRAM, NRAM, race-track memory, FJG, and Millipede memory.

Further, the computer-readable storage medium can include any non-semiconductor memory, such as optical disk storage, magnetic disk storage, magnetic tape, other magnetic storage devices, or any other medium capable of storing one or more instructions. In one or more implementations, the tangible computer-readable storage medium can be directly coupled to a computing device, while in other implementations, the tangible computer-readable storage medium can be indirectly coupled to a computing device, e.g., via one or more wired connections, one or more wireless connections, or any combination thereof.

Instructions can be directly executable or can be used to develop executable instructions. For example, instructions can be realized as executable or non-executable machine code or as instructions in a high-level language that can be compiled to produce executable or non-executable machine code. Further, instructions also can be realized as or can include data. Computer-executable instructions also can be organized in any format, including routines, subroutines, programs, data structures, objects, modules, applications, applets, functions, etc. As recognized by those of skill in the art, details including, but not limited to, the number, structure, sequence, and organization of instructions can vary significantly without varying the underlying logic, function, processing, and output.

While the above discussion primarily refers to microprocessor or multi-core processors that execute software, one or more implementations are performed by one or more integrated circuits, such as ASICs or FPGAs. In one or more implementations, such integrated circuits execute instructions that are stored on the circuit itself.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Any of the blocks may be performed simultaneously. In one or more implementations, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

As used in this specification and any claims of this application, the terms "base station", "receiver", "computer", "server", "processor", and "memory" all refer to electronic or other technological devices. These terms exclude people or groups of people. For the purposes of the specification, the terms "display" or "displaying" means displaying on an electronic device.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The predicate words "configured to", "operable to", and "programmed to" do not imply any particular tangible or intangible modification of a subject, but, rather, are intended to be used interchangeably. In one or more implementations, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

Phrases such as an aspect, the aspect, another aspect, some aspects, one or more aspects, an implementation, the implementation, another implementation, some implementations, one or more implementations, an embodiment, the embodiment, another embodiment, some implementations, one or more implementations, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

The word "exemplary" is used herein to mean "serving as an example, instance, or illustration". Any embodiment described herein as "exemplary" or as an "example" is not necessarily to be construed as preferred or advantageous over other implementations. Furthermore, to the extent that the term "include", "have", or the like is used in the description or the claims, such term is intended to be inclusive in a manner similar to the phrase "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for".

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more". Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A method comprising:
    generating an output stream of compressed textual data, wherein the compressed textual data is generated by:
        preprocessing an input text to alter the input text into altered input text;
        processing each respective byte of the altered input text bit-by-bit in order from most significant bit to least significant bit to generate an n-byte length context and a word context;
        while processing each respective byte:
            predicting a subsequent bit based on the n-byte length context and a prediction model corresponding to the n-byte length,
            predicting the subsequent bit based on the word context and a prediction model corresponding to the word context, and
            combining a plurality of predictions of the subsequent bit to generate a final prediction for the subsequent bit; and
        providing the output stream to another device over a communication interface.

2. The method of claim 1, further comprising:
    using the final prediction as a root for an arithmetic coder.

3. The method of claim 1, wherein the preprocessing of the input text prepends a tag to a sequence of characters or a number, the tag indicating an alteration of the input text.

4. The method of claim 1, wherein the preprocessing of the input text changes all letters of the input text to lower case, replaces words or phrases with a shorter word or phrase, or changes a string of numbers to a numerical form.

5. The method of claim 1, wherein the n-byte length context corresponds to an n-gram model where a value for n is 1, 2, or 4.

6. The method of claim 5, wherein the processing each byte of the altered input text to generate an n-byte length context generates a 1-byte length context, a 2-byte length context, and a 4-byte length context, and wherein the predicting the subsequent bit based on the n-byte length context is based on the 1-byte length context and a prediction model corresponding to the 1-byte length for a first prediction, the 2-byte length context and a prediction model corresponding to the 2-byte length for a second prediction, and the 4-byte length context and a prediction model corresponding to the 4-byte length for a third prediction.

7. The method of claim 1, wherein the word context resets when a next processed byte corresponds to a character other than a letter.

8. The method of claim 1, wherein combining the plurality of predictions of the subsequent bit utilizes a single-layer mixer implementing a multi-dimensional mapping corresponding to a number of predictions in the plurality of predictions.

9. The method of claim 1, wherein the output stream includes a version indicator that indicates to a device receiving the output stream which prediction models were used to generate the output stream.

10. A non-transitory computer-readable medium including instructions, which when executed by at least one computing device, cause the at least one computing device to perform operations including:
    generating an output stream of compressed textual data, wherein the compressed textual data is generated by:
        preprocessing an input text to alter the input text into altered input text;
        processing each respective byte of the altered input text bit-by-bit in order from most significant bit to least significant bit to generate an n-byte length context and a word context;
        while processing each respective byte:
            predicting a subsequent bit based on the n-byte length context and a prediction model corresponding to the n-byte length,
            predicting the subsequent bit based on the word context and a prediction model corresponding to the word context, and
            combining a plurality of predictions of the subsequent bit to generate a final prediction for the subsequent bit; and
    providing the output stream to another device over a communication interface.

11. The non-transitory computer-readable medium of claim 10, wherein the operations further include:
    using the final prediction as a root for an arithmetic coder.

12. The non-transitory computer-readable medium of claim 10,
    wherein the preprocessing of the input text prepends a tag to a sequence of characters or a number, the tag indicating an alteration of the input text, or wherein the preprocessing of the input text changes all letters of the input text to lower case, replaces words or phrases with a shorter word or phrase, or changes a string of numbers to a numerical form.

13. The non-transitory computer-readable medium of claim 10, wherein the processing each byte of the altered input text to generate an n-byte length context generates a 1-byte length context, a 2-byte length context, and a 4-byte length context, and wherein the predicting the subsequent bit based on the n-byte length context is based on the 1-byte length context and a prediction model corresponding to the 1-byte length for a first prediction, the 2-byte length context and a prediction model corresponding to the 2-byte length for a second prediction, and the 4-byte length context and a prediction model corresponding to the 4-byte length for a third prediction.

14. The non-transitory computer-readable medium of claim 10, wherein the word context resets when a next processed byte corresponds to a character other than a letter.

15. The non-transitory computer-readable medium of claim 10, wherein combining the plurality of predictions of the subsequent bit utilizes a single-layer mixer implementing a multi-dimensional mapping corresponding to a number of predictions in the plurality of predictions.

16. A device including an input, an output, a memory and at least one processor communicatively coupled to the memory, the at least one processor configured to:

generate an output stream of compressed textual data, the output stream including:

a first portion including an indicator that compression is used on the output stream; and a second portion including the compressed textual data, wherein the compressed textual data is generated by:

preprocessing an input text to alter the input text into altered input text;

processing each byte of the altered input text bit-by-bit in order from most significant bit to least significant bit to generate an n-byte length context and a word context;

while processing each byte:

predicting a subsequent bit based on the n-byte length context and a prediction model corresponding to the n-byte length, predicting the subsequent bit based on the word context and a prediction model corresponding to the word context, and combining a plurality of predictions of the subsequent bit to generate a final prediction for the subsequent bit;

if the final prediction determines the subsequent bit, then skipping the subsequent bit; and provide the output stream to another device over a communication interface.

17. The device of claim 16, wherein the processor is further configured to:

use the final prediction as a root for an arithmetic coder.

18. The device of claim 16, wherein the preprocessing of the input text prepends a tag to a sequence of characters or a number, the tag indicating an alteration of the input text, or wherein the preprocessing of the input text changes all letters of the input text to lower case, replaces words or phrases with a shorter word or phrase, or changes a string of numbers to a numerical form.

19. The device of claim 16, wherein the processing each byte of the altered input text to generate an n-byte length context generates a 1-byte length context, a 2-byte length context, and a 4-byte length context, and wherein the predicting the subsequent bit based on the n-byte length context is based on the 1-byte length context and a prediction model corresponding to the 1-byte length for a first prediction, the 2-byte length context and a prediction model corresponding to the 2-byte length for a second prediction, and the 4-byte length context and a prediction model corresponding to the 4-byte length for a third prediction.

20. The device of claim 16, wherein the word context resets when a next processed byte corresponds to a character other than a letter.

* * * * *